United States Patent
Park et al.

(10) Patent No.: US 9,830,959 B2
(45) Date of Patent: Nov. 28, 2017

(54) PRECHARGE CIRCUITRY FOR SEMICONDUCTOR MEMORY DEVICE

(71) Applicant: SK hynix Inc., Icheon-si, Gyeonggi-do (KR)

(72) Inventors: Kang Woo Park, Icheon-si (KR); Eun Ji Choi, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/345,101

(22) Filed: Nov. 7, 2016

(65) Prior Publication Data

US 2017/0270981 A1    Sep. 21, 2017

(30) Foreign Application Priority Data

Mar. 17, 2016  (KR) .................. 10-2016-0032015
Apr. 21, 2016  (KR) .................. 10-2016-0048765

(51) Int. Cl.
*G11C 7/10*    (2006.01)
*G11C 7/12*    (2006.01)
*G11C 7/06*    (2006.01)
*G11C 16/10*   (2006.01)

(52) U.S. Cl.
CPC ............. *G11C 7/1048* (2013.01); *G11C 7/06* (2013.01); *G11C 7/106* (2013.01); *G11C 7/12* (2013.01); *G11C 16/10* (2013.01)

(58) Field of Classification Search
CPC ........... G11C 7/1048; G11C 7/12; G11C 7/06; G11C 7/106; G11C 16/10
See application file for complete search history.

(56) References Cited

U.S. PATENT DOCUMENTS

| 2005/0146957 A1* | 7/2005 | Lee ..................... G11C 7/12 365/203 |
| 2010/0157702 A1* | 6/2010 | Seo ..................... G11C 5/025 365/194 |
| 2010/0226192 A1* | 9/2010 | Moon ............... G11C 7/1048 365/203 |
| 2014/0355356 A1* | 12/2014 | Lim ................ G11C 7/1048 365/185.23 |

FOREIGN PATENT DOCUMENTS

| KR | 1020040070174 A | 8/2004 |
| KR | 1020050002483 A | 1/2005 |
| KR | 1020070101073 A | 10/2007 |
| KR | 1020100048420 A | 5/2010 |

* cited by examiner

*Primary Examiner* — Harry W Byrne
*Assistant Examiner* — Ajay Ojha
(74) *Attorney, Agent, or Firm* — William Park & Associates Ltd.

(57) ABSTRACT

A semiconductor memory apparatus may include a memory cell circuit, a data latch circuit, and a first stage amplification circuit. The data latch circuit may be electrically coupled to the memory cell circuit by a bit line. The data latch circuit may latch data transferred through the bit line. The data latch circuit may output latched data to an input/output line in response to a cell select signal. The data first stage amplification circuit may generate driving data to a voltage level of an external power supply voltage in response to a voltage level of the input/output line. The data first stage amplification circuit may precharge the input/output line to a voltage level lower than the external power supply voltage and higher than a ground voltage in response to a precharge signal.

12 Claims, 2 Drawing Sheets

PRECHARGE CIRCUITRY FOR SEMICONDUCTOR MEMORY DEVICE

CROSS-REFERENCES TO RELATED APPLICATION

The present application claims priority under 35 U.S.C. §119(a) to Korean application number 10-2016-0032015 filed on Mar. 17, 2016, and Korean application number 10-2016-0048765 filed on Apr. 21, 2016 in the Korean Intellectual Property Office, which is incorporated herein by reference in its entirety.

BACKGROUND

1. Technical Field

Various embodiments generally relate to a semiconductor integrated circuit, and, more particularly, to a semiconductor memory apparatus.

2. Related Art

With the current trends toward a high speed, large capacity semiconductor memory apparatus, there is an increasing need for the development of internal circuits optimized for the high speed operation and large capacity.

A precharge circuit is a circuit that is used to precharge a certain node or a signal line to a preset voltage level. The precharge circuit is often used to prepare for subsequent operations after having completed a certain operation so that the subsequent operations can be performed without unnecessary delay.

SUMMARY

In an embodiment, a semiconductor memory apparatus may include a memory cell circuit, a data latch circuit, and a first stage amplification circuit. The data latch circuit may be electrically coupled to the memory cell circuit by a bit line. The data latch circuit may latch data transferred through the bit line. The data latch circuit may output latched data to an input/output line in response to a cell select signal. The data first stage amplification circuit may generate driving data to a voltage level of an external power supply voltage when a voltage level of the input/output line is equal to or smaller than a predetermined voltage level. The data first stage amplification circuit may precharge the input/output line to a voltage level lower than the external power supply voltage and higher than a ground voltage in response to a precharge signal.

In an embodiment, a semiconductor memory apparatus may include a data latch circuit, a first stage amplification circuit, and a second stage amplification circuit. The data latch circuit may output data transferred from a memory cell circuit, to an input/output line and a complementary input/output line. The data first stage amplification circuit may drive one of driving data and complementary driving data to a level of an external power supply voltage when any one of the input/output line and the complementary input/output line falls to or below a predetermined voltage level. The data first stage amplification circuit may precharge the input/output line and the input/output line bar to a voltage level lower than the level of the external power supply voltage and higher than a ground voltage in response to a precharge signal. The second stage amplification circuit may compare voltage levels of the driving data and the complementary driving data, and may generate output data.

DETAILED DESCRIPTION

Hereinafter, a semiconductor memory apparatus will be described below with reference to the accompanying drawings through various examples of embodiments.

Figure 1:
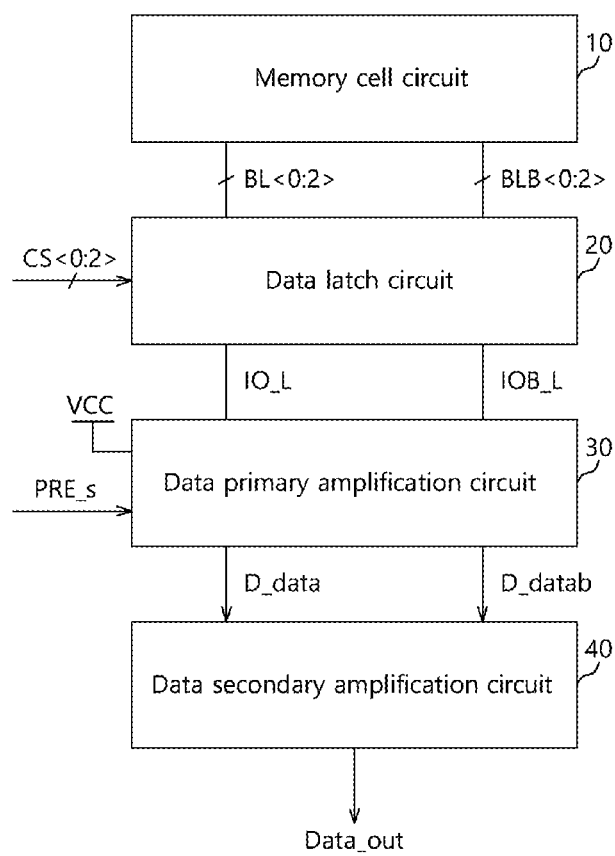
FIG. 1 is a diagram illustrating an example of a semiconductor memory apparatus in accordance with an embodiment.

In FIG. 1, a semiconductor memory apparatus in accordance with an embodiment may include a memory cell circuit 10, a data latch circuit 20, a first stage amplification circuit 30, and a second stage amplification circuit 40.

The memory cell circuit 10 may include an array of memory cells that are used to store data. For example, the memory cells may store data as levels of charge therein. For example, the data input to or output from the memory cell circuit 10 may move through a bit line and a complementary bit line selected between first to third bit lines BL<0:2> and first to third complementary bit lines BLB<0:2>. FIG. 1 illustrates only three bit lines and three complementary bit lines for the purpose of simplicity, and thus this disclosure is not limited thereto.

The data latch circuit 20 may be electrically coupled to the memory cell circuit 10 through the first to third bit lines BL<0:2> and the first to third complementary bit lines BLB<0:2>. For example, the data latch circuit 20 may hold ("latch") data transferred through the first to third bit lines BL<0:2> and the first to third complementary bit lines BLB<0:2>, and may output the latched data through a bit line BL<i> and a complementary bit line BLB<i> corresponding to an enabled cell select signal (a cell select signal CS<i> selected between the first to third cell select signals CS<0:2>) to an input/output line IO_L and a complementary input/output line IOB_L.

The first stage amplification circuit 30 may drive data input through the input/output line IO_L and the complementary input/output line IOB_L, and may output driving data D_data and complementary driving data D_datab. For example, the first stage amplification circuit 30 may generate and output the driving data D_data and the complementary driving data D_datab in response to the voltage levels of the input/output line IO_L and the complementary input/output line IOB_L. The first stage amplification circuit 30 may precharge the input/output line IO_L and the complementary input/output line IOB_L to a level lower than an external power supply voltage VCC and higher than a ground voltage, in response to a precharge signal PRE_s.

The second stage amplification circuit 40 may generate output data Data_out in response to the driving data D_data and the complementary driving data D_datab. For example, the second stage amplification circuit 40 may compare the voltage levels of the driving data D_data and the complementary driving data D_datab, and generate the output data Data_out.

Figure 2:
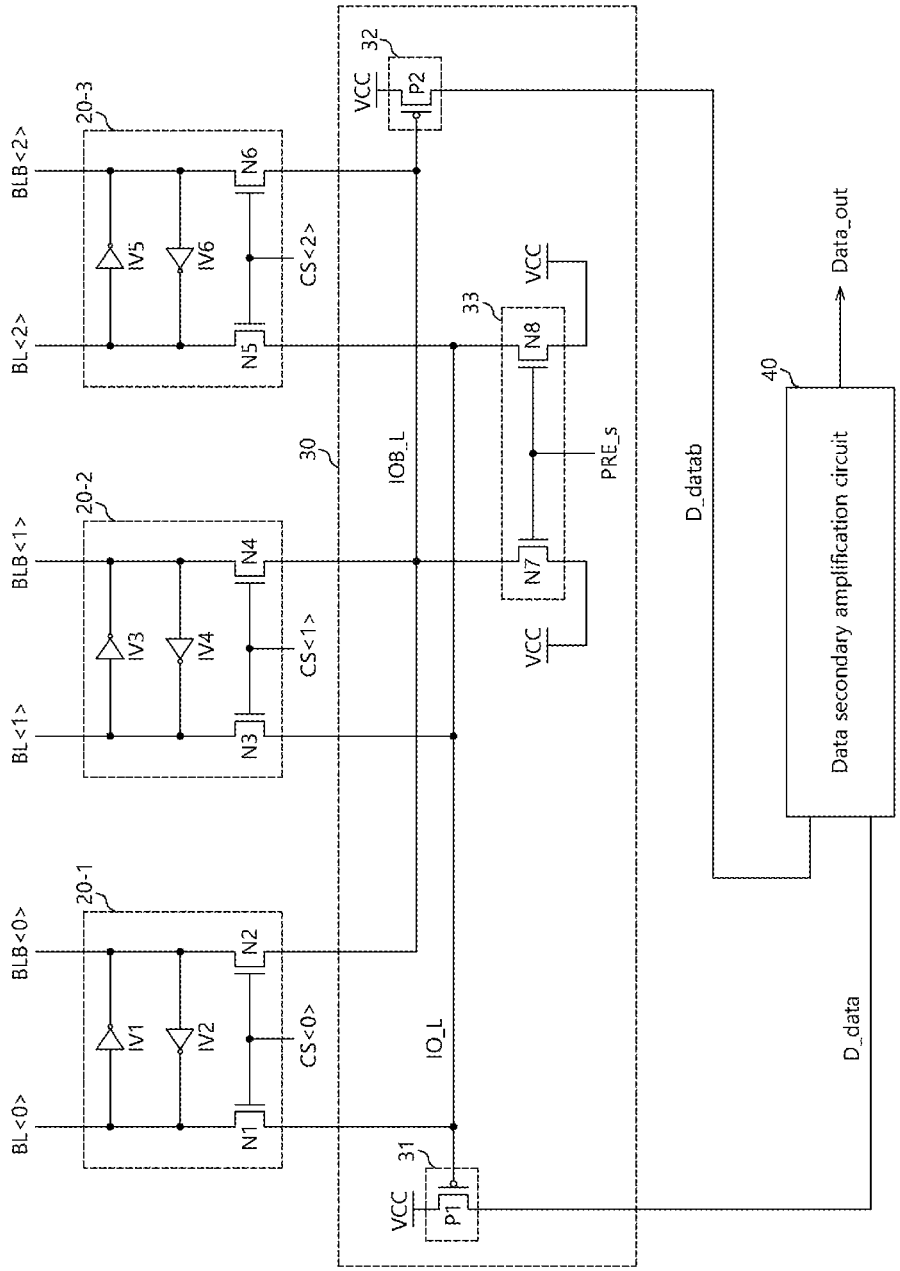
FIG. 2 is a diagram illustrating an example of a semiconductor memory apparatus in accordance with an embodiment.

Examples of the data latch circuit 20, the first stage amplification circuit 30 and the second stage amplification circuit 40 of the semiconductor memory apparatus illustrated in FIG. 1 may include electrical circuits illustrated in FIG. 2.

The data latch circuit 20 may include first to third latch output circuits 20-1, 20-2 and 20-3.

The first latch output circuit 20-1 may hold ("latch") data signals input through the first bit line BL<0> and the first complementary bit line BLB<0>. The first latch output circuit 20-1 may output the latched data signals to the input/output line IO_L and the complementary input/output line IOB_L in response to the first cell select signal CS<0>. For example, the first latch output circuit 20-1 may latch data input through the first bit line BL<0> and the first complementary bit line BLB<0>, and may output the latched data signals to the input/output line IO_L and the complementary input/output line IOB_L when the first cell select signal CS<0> is enabled.

The first latch output circuit 20-1 may include first and second inverters IV1 and IV2, and first and second transistors N1 and N2. The first inverter IV1 may have an input terminal coupled to the first bit line BL<0> and an output terminal coupled to the first complementary bit line BLB<0>. The second inverter IV2 may have an input terminal coupled to the first complementary bit line BLB<0> and an output terminal coupled to the first bit line BL<0>. The first transistor N1 may receive the first cell select signal CS<0> at a gate thereof. The first transistor N1 may also have a drain coupled to the first bit line BL<0> and a source coupled to the input/output line IO_L. Likewise, the second transistor N2 may receive the first cell select signal CS<0> at a gate thereof. The second transistor N2 may also have a drain coupled to the first complementary bit line BLB<0> and a source coupled to the complementary input/output line IOB_L.

The second latch output circuit 20-2 may latch data signals input through the second bit line BL<1> and the second complementary bit line BLB<1>. The second latch output circuit 20-2 may output the latched data signals to the input/output line IO_L and the complementary input/output line IOB_L in response to the second cell select signal CS<1>. For example, the second latch output circuit 20-2 may latch data input through the second bit line BL<1> and the second complementary bit line BLB<1>, and output the latched data signals to the input/output line IO_L and the complementary input/output line IOB_L when the second cell select signal CS<1> is enabled.

The second latch output circuit 20-2 may include third and fourth inverters IV3 and IV4, and third and fourth transistors N3 and N4. The third inverter IV3 may have an input terminal coupled to the second bit line BL<1> and an output terminal coupled to the second complementary bit line BLB<1>. The fourth inverter IV4 may have an input terminal coupled to the second complementary bit line BLB<1> and an output terminal coupled to the second bit line BL<1>. The third transistor N3 may receive the second cell select signal CS<1> at a gate thereof. The third transistor N3 may also have a drain coupled to the second bit line BL<1> and a source coupled to the input/output line IO_L. The fourth transistor N4 may receive the second cell select signal CS<1> at a gate thereof. The fourth transistor N4 may also include a drain coupled to the second complementary bit line BLB<1> and a source coupled to the complementary input/output line IOB_L.

The third latch output circuit 20-3 may latch data signals input through the third bit line BL<2> and the third complementary bit line BLB<2>. The third latch output circuit 20-3 may output the latched data signals to the input/output line IO_L and the complementary input/output line IOB_L in response to the third cell select signal CS<2>. For example, the third latch output circuit 20-3 may latch data input through the third bit line BL<2> and the third complementary bit line BLB<2>, and output the latched data signals to the input/output line IO_L and the complementary input/output line IOB_L when the third cell select signal CS<2> is enabled.

The third latch output circuit 20-3 may include fifth and sixth inverters IV5 and IV6, and fifth and sixth transistors N5 and N6. The fifth inverter IV5 may have an input terminal coupled to the third bit line BL<2> and an output terminal coupled to the third complementary bit line BLB<2>. The sixth inverter IV2 may have an input terminal coupled to the third complementary bit line BLB<2> and an output terminal coupled to the third bit line BL<2>. The fifth transistor N5 may receive the third cell select signal CS<2> at a gate thereof. The fifth transistor N5 may also have a drain coupled to the third bit line BL<2> and a source coupled to the input/output line IO_L. The sixth transistor N6 may receive the third cell select signal CS<2> at a gate thereof. The sixth transistor N6 may also have a drain coupled to the third complementary bit line BLB<2> and a source coupled to the complementary input/output line IOB_L. The respective first to third latch output circuits 20-1, 20-2 and 20-3 may latch data inputted through the first to third bit lines BL<0:2> and the first to third complementary bit lines BLB<0:2> corresponding thereto, and may output the latched data to the input/output line IO_L and the complementary input/output line IOB_L in response to the first to third cell select signals CS<0:2>. In a case where one of the first to third latch output circuits 20-1, 20-2 and 20-3 outputs latched data, the voltage level of the complementary input/output line IOB_L falls if the voltage level of the input/output line IO_L rises, or the voltage level of the complementary input/output line IOB_L rises if the voltage level of the input/output line IO_L falls.

The first stage amplification circuit 30 may include first and second driving circuits 31 and 32, and a precharge circuit 33.

The first driving circuit 31 may drive data of the input/output line IO_L and output the driving data D_data. For example, the first driving circuit 31 may raise the voltage level of the driving data D_data when the voltage level of the input/output line IO_L falls to or below a predetermined voltage level.

The first driving circuit 31 may include a seventh transistor P1. In an embodiment, the seventh transistor P1 may be a PMOS transistor. The seventh transistor P1 may be coupled to the input/output line IO_L at a gate thereof. The seventh transistor P1 may receive the external power supply voltage VCC at a source thereof and output the driving data D_data at a drain thereof.

The second driving circuit 32 may drive data of the complementary input/output line IOB_L and output the complementary driving data D_datab. For example, the second driving circuit 32 may raise the voltage level of the complementary driving data D_datab when the voltage level of the complementary input/output line IOB_L falls to or below the predetermined voltage level.

The second driving circuit 32 may include an eighth transistor P2. In an embodiment, the eighth transistor P1 may be a PMOS transistor. The eighth transistor P2 may be coupled to the complementary input/output line IOB_L at a gate thereof. The eighth transistor P1 may receive the external power supply voltage VCC at a source thereof and output the complementary driving data D_datab at a drain thereof.

The precharge circuit 33 may precharge the input/output line IO_L and the complementary input/output line IOB_L in response to the precharge signal PRE_s. For example, the precharge circuit 33 may precharge the input/output line IO_L and the complementary input/output line IOB_L to a certain voltage level, that is, a voltage level lower than the external power supply voltage VCC and higher than the ground voltage, when the precharge signal PRE_s is enabled.

The precharge circuit 33 may include ninth and tenth transistors N7 and N8. In an embodiment, the ninth and tenth transistors N7 and N8 may be NMOS transistors. The ninth transistor N7 may receive the precharge signal PRE_s at a gate thereof and the external power supply voltage VCC at a drain thereof. A source of the ninth transistor N7 may be coupled to the complementary input/output line IOB_L. The tenth transistor N8 may receive the precharge signal PRE_s at a gate thereof and the external power supply voltage VCC at a drain thereof. A source of the tenth transistor N8 may be coupled to the input/output line IO_L.

The operation of the precharge circuit 33 will be described below in detail. The precharge circuit 33 including the ninth and tenth transistors N7 and N8 may apply a voltage lower than the external power supply voltage VCC to the input/output line IO_L and the complementary input/output line IOB_L. When the precharge signal PRE_s is enabled, the ninth and tenth transistors N7 and N8 may be turned on, and each transistor may transfer a voltage from an input (e.g., drain) to an output (e.g., source) thereof such that its output voltage equals its input voltage (i.e., external power supply voltage VCC) minus a voltage drop (e.g., threshold voltage) across the transistor (i.e., the ninth and tenth transistors N7 and N8). As a result, the ninth transistor N7 may apply a voltage lower than the external power supply voltage VCC to the complementary input/output line IOB_L, and the tenth transistor N8 may apply a voltage lower than the external power supply voltage VCC to the input/output line IO_L. To put it another way, the input/output line IO_L and the complementary input/output line IOB_L may be precharged with a voltage lower than the external power supply voltage VCC. For example, the input/output line IO_L and the complementary input/output line IOB_L may be precharged with a voltage that equals the external power supply voltage VCC minus the voltage drop across the transistor. The voltage drop across the transistor may mean a drain-source voltage drop of the transistor.

The second stage amplification circuit 40 may compare the voltage level of the driving data D_data and the voltage level of the complementary driving data D_datab, and may generate and output the output data Data_out.

The semiconductor memory apparatus in accordance with an embodiment may operate as follows.

Data stored in the memory cell circuit 10 may be output through the first to third bit lines BL<0:2> and the first to third complementary bit lines BLB<0:2>.

The data latch circuit 20 may latch data transferred through the first to third bit lines BL<0:2> and the first to third complementary bit lines BLB<0:2>, and may output, among latched data, data corresponding to an enabled cell select signal (e.g., a cell select signal CS<i> selected between the first to third cell select signals CS<0:2>) to the input/output line IO_L and the complementary input/output line IOB_L.

With reference to FIG. 2, the operation of the data latch circuit 20 will be described below in detail.

The data latch circuit 20 may include the first to third latch output circuits 20-1, 20-2 and 20-3.

The first latch output circuit 20-1 may latch data input through the first bit line BL<0> and the first complementary bit line BLB<0>, and may output the latched data to the input/output line IO_L and the complementary input/output line IOB_L when the first cell select signal CS<0> is enabled.

The second latch output circuit 20-2 may latch data input through the second bit line BL<1> and the second complementary bit line BLB<1>, and may output the latched data to the input/output line IO_L and the complementary input/output line IOB_L when the second cell select signal CS<1> is enabled.

The third latch output circuit 20-3 may latch data input through the third bit line BL<2> and the third complementary bit line BLB<2>, and may output the latched data to the input/output line IO_L and the complementary input/output line IOB_L when the third cell select signal CS<2> is enabled. In a case where the first to third latch output circuits 20-1, 20-2 and 20-3 output latched data in response to the first to third cell select signals CS<0:2>, the voltage level of the input/output line IO_L and the voltage level of the complementary input/output line IOB_L move in opposite directions. In other words, in a case where latched data are output from the first to third latch output circuits 20-1, 20-2 and 20-3, the voltage level of the complementary input/output line IOB_L falls when the voltage level of the input/output line IO_L rises, and the voltage level of the complementary input/output line IOB_L rises when the voltage level of the input/output line IO_L falls. In the case where latched data are output from the first to third latch output circuits 20-1, 20-2 and 20-3, if the voltage level of one of the input/output line IO_L and the input/output line bar IOB_L falls, the voltage level of the other of the input/output line IO_L and the input/output line bar IOB_L rises. That is, if the voltage level of the input/output line IO_L falls, then the voltage level of the complementary input/output line IOB_L rises, and if the voltage level of the input/output line IO_L rises, then the complementary input/output line IOB_L falls.

The first stage amplification circuit 30 may drive one of the driving data D_data and the complementary driving data D_datab to the voltage level of the external power supply voltage VCC when one of the input/output line IO_L and the complementary input/output line IOB_L falls to or below the predetermined voltage level. In detail, the first stage amplification circuit 30 may drive the driving data D_data to the voltage level of the external power supply voltage VCC when the voltage level of the input/output line IO_L falls to or below the predetermined voltage level. The first stage amplification circuit 30 may drive the complementary driving data D_datab to the voltage level of the external power supply voltage VCC when the voltage level of the complementary input/output line IOB_L falls to or below the predetermined voltage level.

The second stage amplification circuit 40 may compare the voltage level of the driving data D_data and the voltage level of the complementary driving data D_datab, and may generate and output the output data Data_out.

After data of the memory cell circuit 10 is output as the output data Data_out through the data latch circuit 20, the first stage amplification circuit 30 and the second stage amplification circuit 40, the precharge signal PRE_s is enabled.

The precharge circuit 33 may precharge the input/output line IO_L and the complementary input/output line IOB_L to a voltage level lower than the voltage level of the external power supply voltage VCC and higher than the ground voltage, when the precharge signal PRE_s is enabled. The precharge circuit 33 may precharge the input/output line IO_L and the complementary input/output line IOB_L to an extent that allows the first and second driving circuits 31 and 32 (i.e., PMOS transistors P1 and P2) to stay off (i.e., 'turn-off' state). The precharge circuit 33 in accordance with an embodiment may include NMOS transistors N7 and N8 such that the NMOS transistors N7 and N8 turned on in response to the precharge signal PRE_s enabled can drop the external power supply voltage VCC to a voltage level lower than the voltage level of the external power supply voltage VCC and higher than the ground voltage. As a result, the voltage level lower than the voltage level of the external power supply voltage VCC may be applied to precharge the input/output line IO_L and the complementary input/output line IOB_L.

Since the first and second driving circuits 31 and 32 generate and output the driving data D_data and the complementary driving data D_datab only when the input/output line IO_L and the complementary input/output line IOB_L fall to or below the predetermined voltage level, if the input/output line IO_L and the complementary input/output line IOB_L are precharged to a voltage level lower than the level of the external power supply voltage VCC, that is, to a voltage that equals the external power supply voltage VCC minus the voltage drop across the transistor (e.g., the NMOS transistors N7 and N8), the memory cell circuit 10 may quickly generate and output the output data Data_out.

While various embodiments have been described above, it will be understood to those skilled in the art that the embodiments described are examples only. Accordingly, the semiconductor memory apparatus described herein should not be limited based on the described embodiments.

What is claimed is:

1. A semiconductor memory apparatus comprising:
    a memory cell circuit;
    a data latch circuit electrically coupled to the memory cell circuit by a bit line, latching data transferred through the bit line, and outputting latched data to an input/output line in response to a cell select signal; and
    a first stage amplification circuit configured to generate driving data with a voltage level of an external power supply voltage in response to a voltage level of the input/output line, the first stage amplification circuit directly precharging the input/output line to a voltage level lower than the external power supply voltage and higher than a ground voltage in response to a precharge signal.

2. The semiconductor memory apparatus according to claim 1, wherein the first stage amplification circuit comprises:
    a driving circuit configured to generate the driving data when the voltage level of the input/output line is equal to or smaller than a predetermined voltage level; and
    a precharge circuit configured to precharge the input/output line to the voltage level lower than the external power supply voltage and higher than the ground voltage in response to the precharge signal.

3. The semiconductor memory apparatus according to claim 2, wherein the driving circuit comprises a PMOS transistor, and a gate of the PMOS transistor is coupled to the input/output line, a source of the PMOS transistor receives the external power supply voltage, and a drain of the PMOS transistor output the driving data.

4. The semiconductor memory apparatus according to claim 3, wherein the precharge circuit precharges the input/output line to an extent that allows the PMOS transistor stay off.

5. The semiconductor memory apparatus according to claim 4, wherein the precharge circuit comprises an NMOS transistor, and, in response to the precharge signal, the precharge circuit precharges the input/output line to a voltage level that equals the external power supply voltage minus a voltage drop across the NMOS transistor.

6. The semiconductor memory apparatus according to claim 5, wherein the precharge circuit comprises the NMOS transistor, and a gate of the NMOS transistor receives the precharge signal, a drain of the NMOS transistor receives the external power supply voltage, and a source of the NMOS transistor is coupled to the input/output line.

7. A semiconductor memory apparatus comprising:
    a data latch circuit configured to output data transferred from a memory cell circuit, to an input/output line and a complementary input/output line;
    a first stage amplification circuit configured to drive one of driving data and complementary driving data to a level of an external power supply voltage when any one of the input/output line and the complementary input/output line falls to or below a predetermined voltage level, and directly precharge the input/output line and the complementary input/output line to a voltage level lower than the level of the external power supply voltage and higher than a ground voltage in response to a precharge signal; and
    a second stage amplification circuit configured to compare voltage levels of the driving data and the complementary driving data, and generate output data.

8. The semiconductor memory apparatus according to claim 7, wherein the data latch circuit raises the voltage level of one of the input/output line and the complementary input/output line and lowers the voltage level of the other of the input/output line and the input/output line in response to the data transferred from the memory cell circuit.

9. The semiconductor memory apparatus according to claim 8, wherein the data first stage amplification circuit comprises:
    a first driving circuit configured to generate the driving data in response to the voltage level of the input/output line;
    a second driving circuit configured to generate the complementary driving data in response to the voltage level of the complementary input/output line; and
    a precharge circuit configured to precharge the input/output line and the complementary input/output line in response to the precharge signal.

10. The semiconductor memory apparatus according to claim 9, wherein each of the first and second driving circuits comprises a PMOS transistor.

11. The semiconductor memory apparatus according to claim 10, wherein the precharge circuit precharges the input/output line and the complementary input/output line to an extent that allows the PMOS transistor stay off.

12. The semiconductor memory apparatus according to claim 11, wherein the precharge circuit comprises an NMOS transistor that is turned on when the precharge signal is enabled, and the precharge circuit precharges the input/output line and the complementary input/output line to a voltage level that equals the external power supply voltage minus a voltage drop across the NMOS transistor.

* * * * *